United States Patent
Takobe et al.

(10) Patent No.: US 11,068,003 B2
(45) Date of Patent: Jul. 20, 2021

(54) DIFFERENTIAL AMPLIFIER

(71) Applicant: Rohm Co., Ltd., Kyoto (JP)

(72) Inventors: Isao Takobe, Kyoto (JP); Yuhei Yamaguchi, Koto (JP); Tetsuo Tateishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/666,084

(22) Filed: Oct. 28, 2019

(65) Prior Publication Data

US 2020/0133323 A1 Apr. 30, 2020

(30) Foreign Application Priority Data

Oct. 31, 2018 (JP) .............................. JP2018-205813

(51) Int. Cl.
| | |
|---|---|
| *G05F 1/575* | (2006.01) |
| *H03F 3/45* | (2006.01) |
| *H03F 3/68* | (2006.01) |
| *H03F 1/34* | (2006.01) |
| *B60R 16/03* | (2006.01) |
| *G05F 1/59* | (2006.01) |

(52) U.S. Cl.
CPC .............. *G05F 1/575* (2013.01); *B60R 16/03* (2013.01); *G05F 1/59* (2013.01); *H03F 1/34* (2013.01); *H03F 3/45071* (2013.01); *H03F 3/68* (2013.01); *H03F 2200/375* (2013.01); *H03F 2203/45212* (2013.01); *H03F 2203/45528* (2013.01)

(58) Field of Classification Search
CPC . G05F 1/575; G05F 1/59; B60R 16/03; H03F 1/34; H03F 3/45071; H03F 3/68; H03F 2200/375; H03F 2203/45212; H03F 2203/45528
See application file for complete search history.

(56) References Cited

U.S. PATENT DOCUMENTS

| | | | |
|---|---|---|---|
| 6,262,633 B1* | 7/2001 | Close | H03F 1/3217 330/255 |
| 8,159,301 B1* | 4/2012 | Duffy | H03F 3/45219 330/253 |
| 8,310,307 B2* | 11/2012 | Kawaguchi | H03F 3/4517 330/255 |
| 2017/0187278 A1* | 6/2017 | Yamaguchi | H03K 17/082 |

FOREIGN PATENT DOCUMENTS

JP 2003-084843 3/2003

\* cited by examiner

*Primary Examiner* — Carlos Amaya
(74) *Attorney, Agent, or Firm* — Fish & Richardson P.C.

(57) ABSTRACT

There is provided a differential amplifier including: an inverting input terminal to which a first voltage is applied; a non-inverting input terminal to which a second voltage proportional to the first voltage is applied; and an offset part configured to generate a predetermined input offset voltage between the inverting input terminal and the non-inverting input terminal.

13 Claims, 6 Drawing Sheets

DIFFERENTIAL AMPLIFIER

CROSS-REFERENCE TO RELATED APPLICATION

This application is based upon and claims the benefit of priority from Japanese Patent Application No. 2018-205813, filed on Oct. 31, 2018, the entire contents of which are incorporated herein by reference.

TECHNICAL FIELD

The present disclosure relates to a differential amplifier.

BACKGROUND

A differential amplifier is used in various circuits. For example, a linear power supply circuit such as LDO (low drop out) or the like includes a differential amplifier that generates an error voltage corresponding to a difference between a voltage based on the output voltage of the linear power supply circuit and a reference voltage. In addition, for example, a switching power supply circuit includes a differential amplifier that generates an error voltage corresponding to a difference between a voltage based on the output voltage of the switching power supply circuit and a reference voltage. Further, for example, a light emitting element driving circuit includes a differential amplifier that generates an error voltage corresponding to a difference between a voltage based on the output current of the light emitting element driving circuit and a reference voltage.

The differential amplifier that generates the error voltage described above receives a reference voltage from a reference voltage source. In order to reduce the current consumption of the reference voltage source, it is necessary to increase the resistance of the reference voltage source, which leads to a problem that the circuit area of the reference voltage source increases. Therefore, it is desirable that the reference voltage source is reduced in order to achieve both low current consumption and size reduction in a circuit including a differential amplifier.

SUMMARY

Some embodiments of the present disclosure provide a differential amplifier capable of outputting a voltage corresponding to a difference between a reference voltage and an externally supplied voltage without supplying the reference voltage from a reference voltage source.

According to one embodiment of the present disclosure, there is provided a configuration (first configuration) of a differential amplifier including: an inverting input terminal to which a first voltage is applied; a non-inverting input terminal to which a second voltage proportional to the first voltage is applied; and an offset part configured to generate a predetermined input offset voltage between the inverting input terminal and the non-inverting input terminal.

According to another embodiment of the present disclosure, there is provided a configuration (second configuration) of a power supply circuit for supplying an output to a load that includes: the differential amplifier of the first configuration configured to generate an error voltage corresponding to the output.

According to another embodiment of the present disclosure, there is provided a configuration (third configuration) of a linear power supply circuit including: an output transistor provided between an input terminal to which an input voltage is applied and an output terminal to which an output voltage is applied; and a driver configured to drive the output transistor based on a difference between a voltage based on the output voltage and a reference voltage, wherein the driver includes: the differential amplifier of the first configuration configured to output a voltage corresponding to the difference between the voltage based on the output voltage and the reference voltage; a first capacitor including one end to which an output of the differential amplifier is applied and the other end to which a ground potential is applied; a converter configured to convert a voltage based on the output of the differential amplifier into a current and to output the current; and a current amplifier configured to amplify the current outputted from the converter, wherein a power supply voltage of the differential amplifier and a power supply voltage of the converter are dependent on the output voltage, and wherein the reference voltage corresponds to the input offset voltage.

According to another embodiment of the present disclosure, there is provided a configuration (fourth configuration) of a linear power supply circuit including: an output transistor provided between an input terminal to which an input voltage is applied and an output terminal to which an output voltage is applied; and a driver configured to drive the output transistor based on a difference between a voltage based on the output voltage and a reference voltage, wherein the driver includes: the differential amplifier of the first configuration configured to output a voltage corresponding to the difference between the voltage based on the output voltage and the reference voltage; a first capacitor including one end to which an output of the differential amplifier is applied and the other end to which the voltage based on the output voltage is applied; a converter configured to convert a voltage based on the output of the differential amplifier into a current and to output the current; and a current amplifier configured to amplify the current outputted from the converter, wherein a power supply voltage of the differential amplifier is a first constant voltage and a power supply voltage of the current amplifier is a second constant voltage, or the power supply voltage of the differential amplifier and the power supply voltage of the current amplifier are the input voltage, and wherein the reference voltage corresponds to the input offset voltage.

According to another embodiment of the present disclosure, there is provided a configuration (fifth configuration) that in the linear power supply circuit of the third configuration, a power supply voltage of the current amplifier is a constant voltage.

According to another embodiment of the present disclosure, there is provided a configuration (sixth configuration) that in the linear power supply circuit of the fourth configuration, a withstand voltage of the differential amplifier and a withstand voltage of the converter are lower than a withstand voltage of the current amplifier.

According to another embodiment of the present disclosure, there is provided a configuration (seventh configuration) that in the differential amplifier of the third configuration, a gain of the differential amplifier is smaller than a gain of the current amplifier.

According to another embodiment of the present disclosure, there is provided a configuration (eighth configuration) that in the differential amplifier of the third configuration, the current amplifier includes a plurality of current sink type current mirror circuits and a plurality of current source type current mirror circuits, wherein a mirror ratio of each of the current sink type current mirror circuits is 5 or smaller, and wherein a mirror ratio of each of the current source type current mirror circuits is 5 or smaller.

According to another embodiment of the present disclosure, there is provided a configuration (ninth configuration)

DETAILED DESCRIPTION

Figure 1:
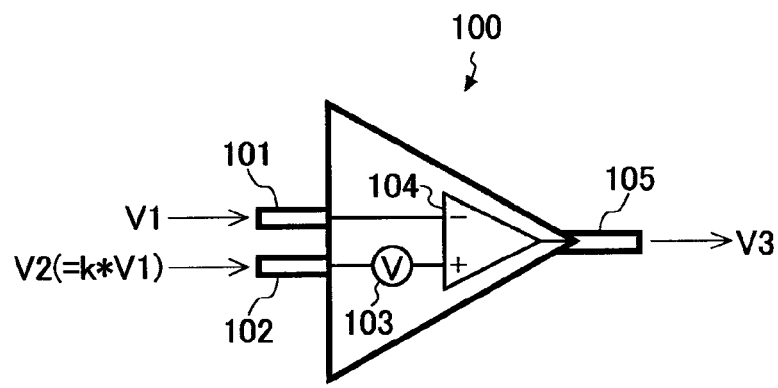
FIG. 1 is a view showing a schematic configuration of a differential amplifier according to an embodiment.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

<1. Differential Amplifier>

FIG. 1 is a view illustrating a schematic configuration of a differential amplifier according to an embodiment. The differential amplifier 100 includes an inverting input terminal 101 to which a first voltage V1 is applied, a non-inverting input terminal 102 to which a second voltage V2 substantially proportional to the first voltage V1 is applied, an offset part 103 configured to generate a predetermined input offset voltage between the inverting input terminal 101 and the non-inverting input terminal 102, an ideal differential amplifier 104 that does not generate an input offset voltage, and an output terminal 105. The differential amplifier 100 generates an error voltage V3 and outputs the error voltage V3 from the output terminal 105.

If it is assumed that the ratio of the second voltage V2 to the first voltage V1 is k, the predetermined input offset voltage generated by the offset part 103 is α, and the gain of the differential amplifier 104 is β, the following equation is established.

$$V3 = \beta(V2 - V1 + \alpha) \quad \text{[Equation 1]}$$
$$= \beta\{(k-1)V1 + \alpha\}$$
$$= \beta(k-1)\{V1 + \alpha/(k-1)\}$$

The differential amplifier 100 can output the error voltage V3 corresponding to the difference between the reference voltage and the first voltage V1 without supplying the reference voltage from a reference voltage source. The reference voltage is a voltage that depends on a predetermined input offset voltage a generated by the offset part 103 and a ratio k of the second voltage V2 to the first voltage V1.

The specific configuration of the offset part 103 is not particularly limited. For example, it is only necessary that the differential pair transistors of the differential amplifier 104 have different sizes (=gate width/gate length) so that the differential amplifier 104 also serves as the offset part 103.

<2. Power Supply Circuit>

The differential amplifier 100 may be used in, for example, various power supply circuits.

Figure 2:
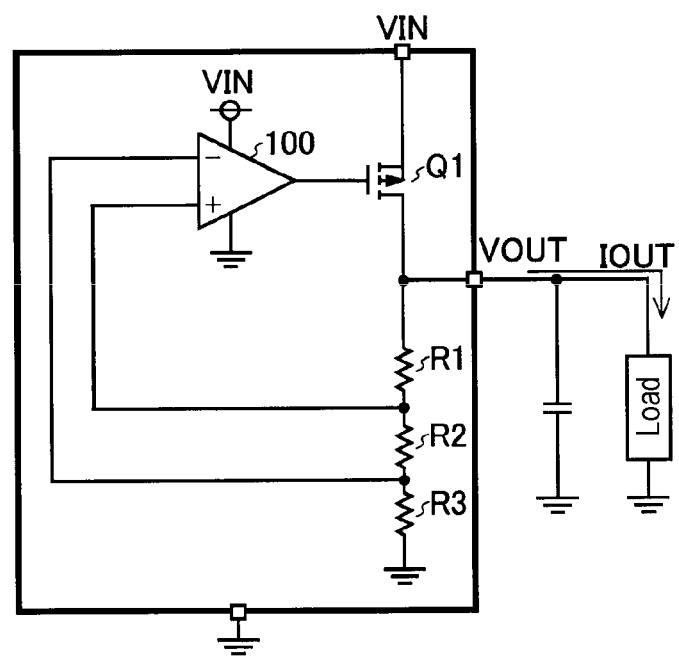
FIG. 2 is a view showing a configuration example of a linear power supply circuit.

FIG. 2 is a view showing an example in which the differential amplifier 100 is used in a linear power supply circuit. The linear power supply circuit shown in FIG. 2 includes an output transistor Q1, resistors R1 to R3 configured to divide an output voltage VOUT, and the differential amplifier 100 configured to control the conductivity of the output transistor Q1.

Figure 3:
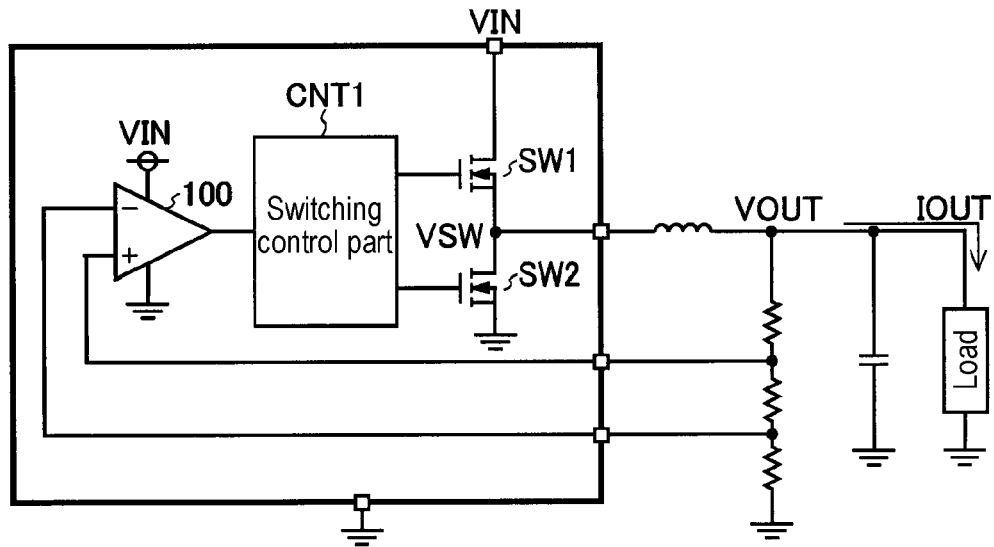
FIG. 3 is a view showing a configuration example of a switching power supply circuit.
Figure 4:
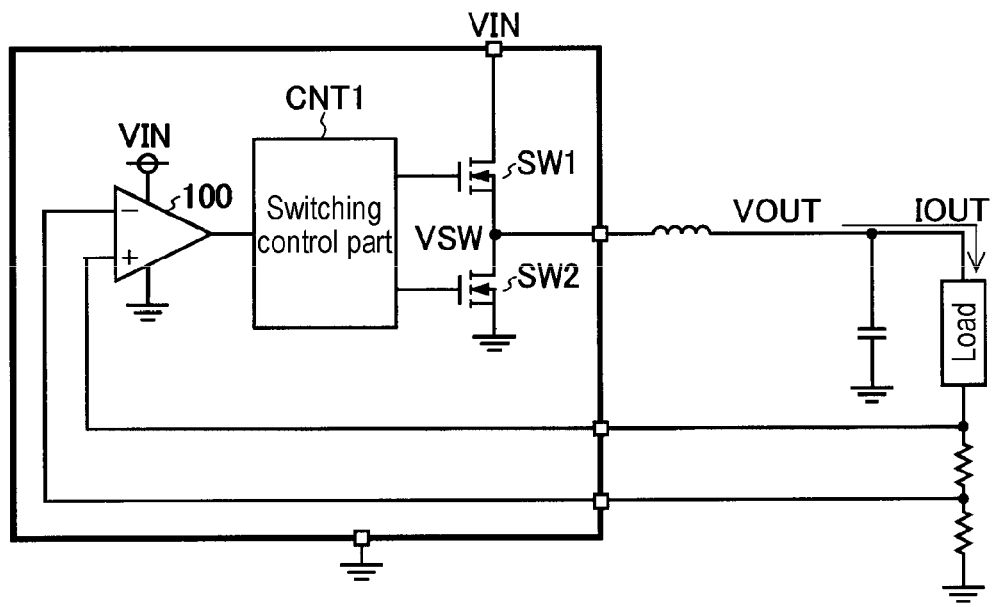
FIG. 4 is a view showing another configuration example of a switching power supply circuit.

FIG. 3 is a view showing an example in which the differential amplifier 100 is used in a switching power supply circuit that controls an output voltage VOUT at a constant voltage. FIG. 4 is a view showing an example in which the differential amplifier 100 is used in a switching power supply circuit that performs constant current control on an output current IOUT. Each of the switching power supply circuit shown in FIG. 3 and the switching power supply circuit shown in FIG. 4 includes switching elements SW1 and SW2, the differential amplifier 100, and a switching control part CNT1 that complementarily controls the on/off of the switching elements SW1 and SW2 according to the output of the differential amplifier 100.

<3. Example of Linear Power Supply Circuit Capable of High-Speed Response>

Figure 5:
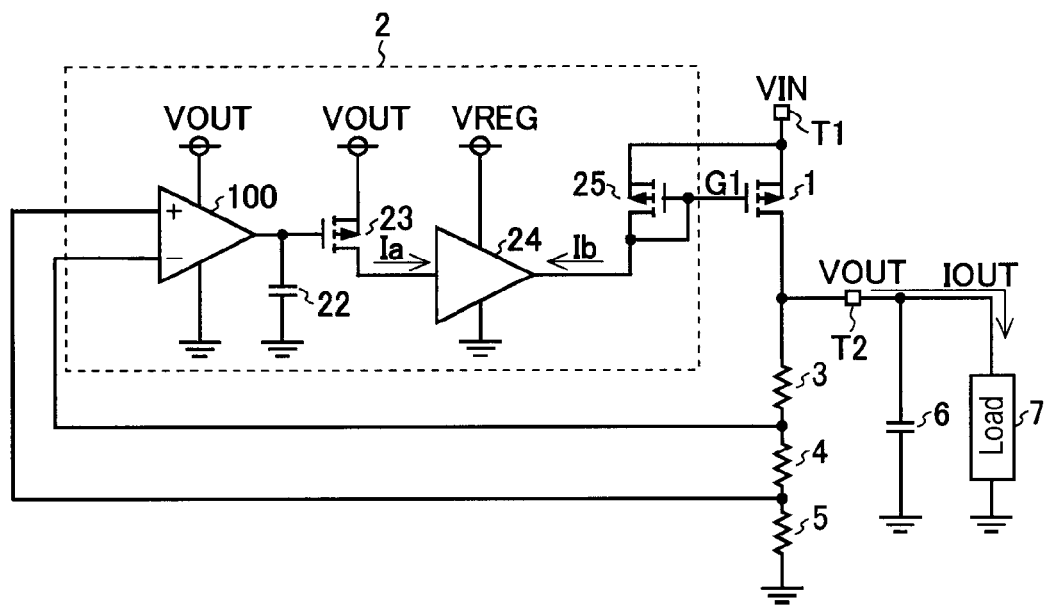
FIG. 5 is a view showing a configuration example of a linear power supply circuit capable of high-speed response.

FIG. 5 is a view showing a configuration example of a linear power supply circuit developed by the present inventors as a linear power supply circuit capable of high-speed response. In FIG. 5, the same parts as those shown in FIG. 1 are denoted by like reference numerals, and the detailed description thereof is omitted. The linear power supply circuit shown in FIG. 5 includes an input terminal T1, an output terminal T2, an output transistor 1, a driver 2, and resistors 3 to 5.

An output capacitor 6 and a load 7 are externally attached to the linear power supply circuit shown in FIG. 5. Specifically, the output capacitor 6 and the load 7 are externally connected in parallel to the output terminal T2. The linear power supply circuit shown in FIG. 5 steps down an input voltage VIN to generate an output voltage VOUT, and supplies the output voltage VOUT to the load 7.

The output transistor 1 is provided between the input terminal T1 to which the input voltage VIN is applied and the output terminal T2 to which the output voltage VOUT is applied.

The driver 2 drives the output transistor 1. Specifically, the driver 2 drives the output transistor 1 by supplying a gate signal G1 to the gate of the output transistor 1. The conductivity (in other words, the on-resistance) of the output transistor 1 is controlled by the gate signal G1. In the configuration shown in FIG. 5, a PMOSFET (P-channel type MOSFET) is used as the output transistor 1. Therefore, the lower the gate signal G1, the higher the conductivity of the output transistor 1 and the higher the output voltage VOUT. Conversely, the higher the gate signal G1, the lower the conductivity of the output transistor 1 and the lower the output voltage VOUT. However, as the output transistor 1, an NMOSFET may be used instead of the PMOSFET, or a bipolar transistor may be used.

The driver 2 drives the output transistor 1 based on a difference value between a voltage based on the output voltage VOUT and a reference voltage.

The driver 2 includes the differential amplifier 100, a capacitor 22, a PMOSFET 23, a current amplifier 24, and a PMOSFET 25.

The power supply voltage of the differential amplifier 100 is the output voltage VOUT. That is, the differential amplifier 100 is driven by a voltage between the output voltage VOUT and the ground potential. As the power supply voltage of the differential amplifier 100, a voltage which is lower than the output voltage VOUT and depends on the output voltage VOUT may be used instead of the output voltage VOUT.

The withstand voltage of the differential amplifier 100 and the PMOSFET 23 is lower than the withstand voltage of the current amplifier 24. The gain of the differential amplifier 100 is smaller than the gain of the current amplifier 24. This makes it possible to reduce the size of the differential amplifier 100 and the PMOSFET 23.

The withstand voltage of the PMOSFET 23 is lower than the withstand voltage of the current amplifier 24. This makes it possible to reduce the size of PMOSFET 23.

The output of the differential amplifier 100 is applied to one end of the capacitor 22, and the ground potential is applied to the other end of the capacitor 22.

An output voltage VOUT is applied to the source of the PMOSFET 23, and a voltage based on the output of the differential amplifier 100 (a connection node voltage between the differential amplifier 100 and the capacitor 22) is applied to the gate of the PMOSFET 23. The PMOSFET 23 converts the voltage based on the output of the differential amplifier 100 into a current and outputs the current from the drain. Since the connection node between the differential amplifier 100 and the capacitor 22 is grounded in a high frequency band, it is possible to perform high-speed response of the driver 2. Since the differential amplifier 100 does not have to perform high-speed response, it is possible to increase the resistance of the differential amplifier 100 and to reduce the current consumption of the differential amplifier 100.

The current amplifier 24 amplifies the current Ia outputted from the drain of the PMOSFET 23. The power supply voltage of the current amplifier 24 is a constant voltage VREG. That is, the current amplifier 24 is driven by a voltage between the constant voltage VREG and the ground potential.

The PMOSFET 25 forms a current mirror circuit together with the output transistor 1. The PMOSFET 25 converts the current Ib outputted from the current amplifier 24 into a voltage and supplies the voltage to the gate of the output transistor 1.

Figure 6:
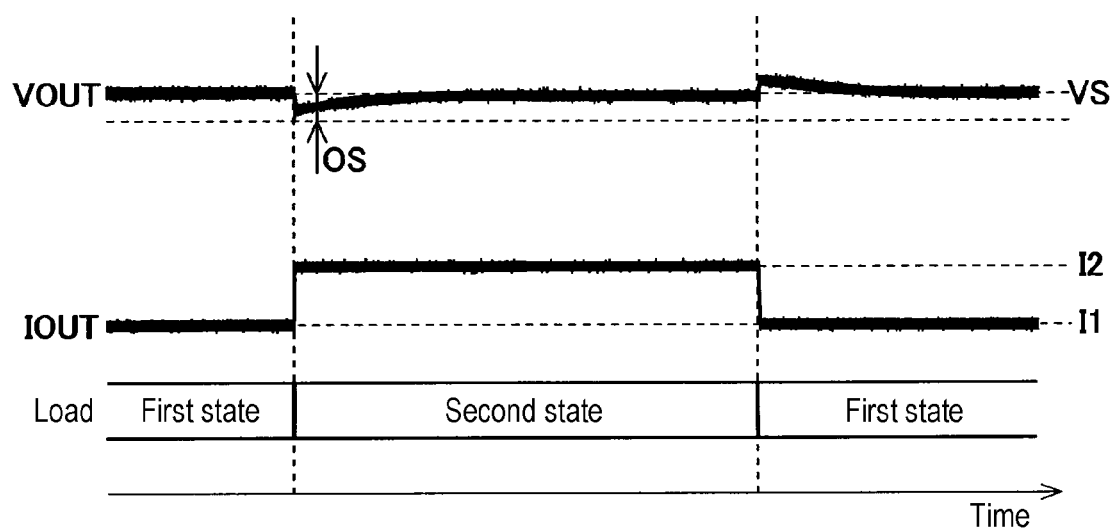
FIG. 6 is a time chart showing output characteristics of the linear power supply circuit shown in FIG. 5.

FIG. 6 is a time chart showing output characteristics of the linear power supply circuit shown in FIG. 5. FIG. 6 shows a time chart available when the load 7 is switched from a first state to a second state and then returned to the first state again in a state in which the set value of the output voltage VOUT is VS and the capacitance of the output capacitor 6 is a predetermined value. The first state is a light load state in which the theoretical value of the output current IOUT is I1, and the second state is a heavy load state in which the theoretical value of the output current IOUT is I2 (>I1).

Since the linear power supply circuit shown in FIG. 5 is capable of high-speed response, it is possible to reduce the overshoot amount OS.

Figure 7:
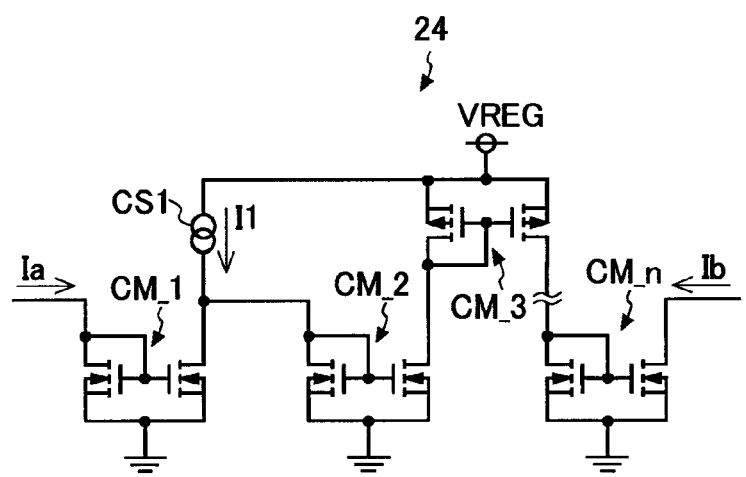
FIG. 7 is a view showing a configuration example of a current amplifier.

FIG. 7 is a view showing a configuration example of the current amplifier 24. The current amplifier 24 includes current sink type current mirror circuits CM_1, CM_2, ... and CM_n, and current source type current mirror circuits CM_3, ... and CM_n−1 (where CM_n−1 is not shown in FIG. 7). The current sink type current mirror circuits and the current source type current mirror circuits are alternately arranged from the input of the current amplifier 24 to the output thereof between the current sink type current mirror circuit CM_1, the constant current source CS1 for supplying the constant current I1, and the current sink type current mirror circuit CM_n. In order to keep the pole generated in each current mirror circuit as low as possible, the mirror ratio of each current mirror circuit (the ratio of the size of the output side transistor to the size of the input side transistor) is preferably 5 or smaller, and more preferably 3 or smaller. However, the smaller the mirror ratio of each current mirror circuit, the larger the circuit area of the current amplifier 24. Therefore, the mirror ratio of each current mirror circuit may be determined in consideration of the trade-off between the improvement in frequency characteristics and the size reduction.

<4. Other Examples of Linear Power Supply Circuit Capable of High-Speed Response>

Figure 8A:
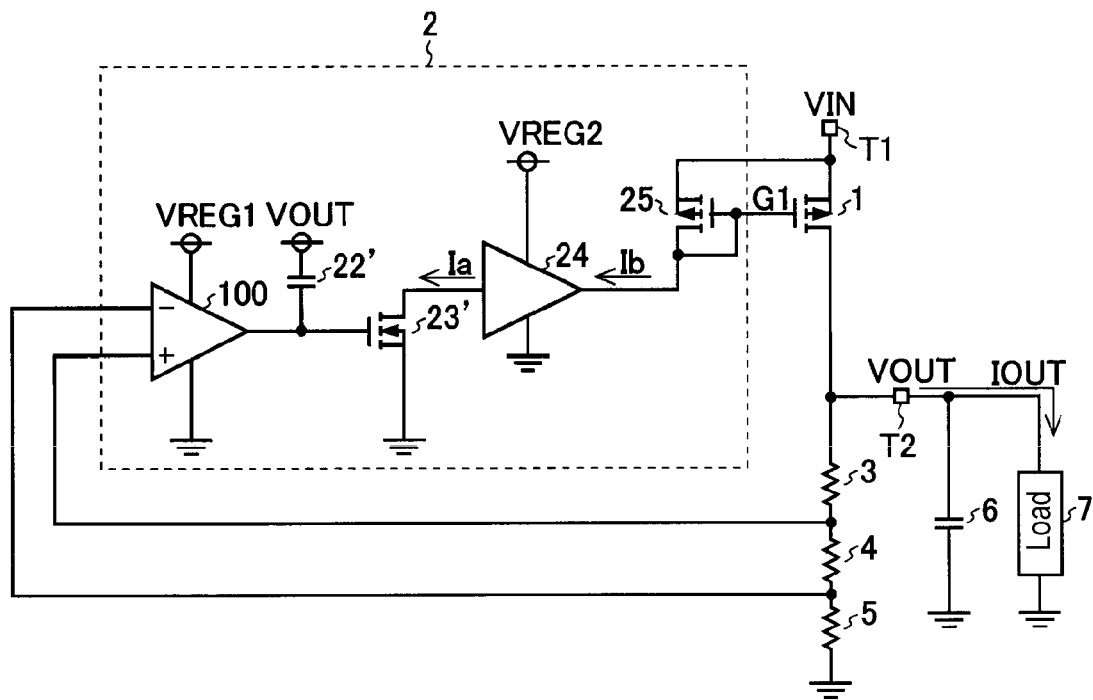
FIG. 8A is a view showing another configuration example of a linear power supply circuit capable of high-speed response.

FIG. 8A is a view showing another configuration example of a linear power supply circuit developed by the present inventors as a linear power supply circuit capable of high-speed response. In FIG. 8A, the same parts as those shown in FIGS. 1 and 5 are denoted by like reference numerals, and the detailed description thereof is omitted.

In this configuration example, the driver 2 includes a differential amplifier 100, a capacitor 22', an NMOSFET 23', a current amplifier 24, and a PMOSFET 25.

Unlike the configuration example shown in FIG. 5, the power supply voltage of the differential amplifier 100 is a first constant voltage VREG1. That is, the differential amplifier 100 is driven by a voltage between the first constant voltage VREG1 and the ground potential.

The withstand voltage of the differential amplifier 100 and the NMOSFET 23' is lower than the withstand voltage of the current amplifier 24. The gain of the differential amplifier 100 is smaller than the gain of the current amplifier 24. As a result, the differential amplifier 100 and the NMOSFET 23' can be reduced in size.

The output of the differential amplifier 100 is applied to one end of the capacitor 22', and the output voltage VOUT is applied to the other end of the capacitor 22'. Instead of the output voltage VOUT, a voltage that depends on the output voltage VOUT may be applied to the other end of the capacitor 22'.

A ground potential is applied to the source of the NMOSFET 23', and a voltage based on the output of the differential amplifier 100 (a connection node voltage between the differential amplifier 100 and the capacitor 22') is applied to the gate of the NMOSFET 23'. The NMOSFET 23' converts the voltage based on the output of the differential amplifier 100 into a current and outputs the current from the drain. Since the connection node between the differential amplifier 100 and the capacitor 22' is grounded to the output voltage VOUT in the high frequency band, it is possible for the driver 2 to perform high-speed response.

Figure 8B:
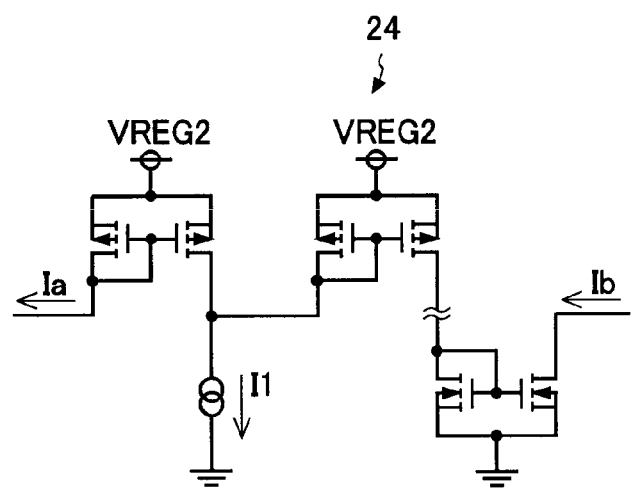
FIG. 8B is a view showing another configuration example of a current amplifier.

The current amplifier 24 amplifies the current Ia outputted from the drain of the NMOSFET 23'. The power supply voltage of the current amplifier 24 is a second constant voltage VREG2. That is, the current amplifier 24 is driven by a voltage between the second constant voltage VREG2 and the ground potential. The first constant voltage VREG1 and the second constant voltage VREG2 may be the same value or may be different values. In this configuration example, the current Ia flows from the current amplifier 24 toward the NMOSFET 23'. Therefore, the current amplifier 24 may have, for example, a circuit configuration shown in FIG. 8B.

The linear power supply circuit shown in FIG. 8A has the same effects as those of the linear power supply circuit shown in FIG. 5. Furthermore, the linear power supply circuit shown in FIG. 8A can ensure operation of the differential amplifier 100 even when the set value of the output voltage VOUT is low. When a low voltage is used as the input voltage VIN, the input voltage VIN may be used as the power supply voltage of the differential amplifier 100 instead of the first constant voltage VREG1, and the input voltage VIN may be used as the power supply voltage of the current amplifier 24 instead of the second constant voltage VREG2.

<5. Application>

Figure 9:
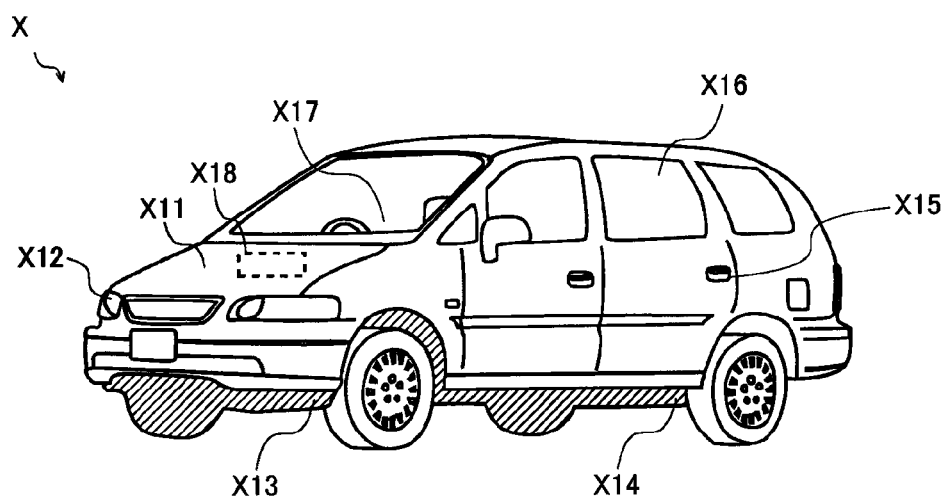
FIG. 9 is an external view of a vehicle.

FIG. 9 is an external view of a vehicle X. The vehicle X in this configuration example is equipped with various electronic devices X11 to X18 that are operated by receiving a voltage outputted from a battery (not shown). The mounting positions of the electronic devices X11 to X18 in this figure may be different from the actual ones for the convenience of illustration.

The electronic device X11 is an engine control unit that performs control related to an engine (injection control, electronic throttle control, idling control, oxygen sensor/heater control, auto cruise control, and the like).

The electronic device X12 is a lamp control unit that performs the on/off control of an HID (high intensity discharged lamp), a DRL (daytime running lamp), and the like.

The electronic device X13 is a transmission control unit that performs control related to a transmission.

The electronic device X14 is a brake unit that performs control (ABS [anti-lock brake system] control, EPS [electric power steering] control, electronic suspension control, and the like) related to the motion of the vehicle X.

The electronic device X15 is a security control unit that performs drive control of a door lock, a security alarm, and the like.

The electronic device X16 is an electronic device that is incorporated into the vehicle X at the factory shipment stage as a standard equipment item or manufacturer's option product, such as a wiper, an electric door mirror, a power window, a damper (shock absorber), an electric sunroof, and an electric seat.

The electronic device X17 is an electronic device that is optionally mounted on the vehicle X as a user option product such as an in-vehicle A/V (audio/visual) device, a car navigation system, and an ETC (electronic toll collection system).

The electronic device X18 is an electronic device that includes a high-withstand-voltage motor such as an in-vehicle blower, an oil pump, a water pump, a battery cooling fan, or the like.

The linear power supply circuit described above can be incorporated in any of the electronic devices X11 to X18.

<6. Others>

The above-described embodiments are examples in all respects and should not be considered to be limitative. The technical scope of the present disclosure is determined by the scope of the claims, not the description of the above-described embodiments. Therefore, it should be understood that the technical scope of the present disclosure embraces all modifications falling within the meaning and range of equivalents of the claims.

According to the present disclosure in some embodiments, it is possible to provide a differential amplifier capable of outputting a voltage corresponding to a difference between a reference voltage and an externally supplied voltage without supplying the reference voltage from a reference voltage source.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A linear power supply circuit, comprising:
an output transistor provided between an input terminal to which an input voltage is applied and an output terminal to which an output voltage is applied; and
a driver configured to drive the output transistor based on a difference between a voltage based on the output voltage and a reference voltage, wherein the driver includes:
a differential amplifier configured to output a voltage corresponding to the difference between the voltage based on the output voltage and the reference voltage, and including:
an inverting input terminal to which a first voltage is applied;
a non-inverting input terminal to which a second voltage proportional to the first voltage is applied; and
an offset part configured to generate a predetermined input offset voltage between the inverting input terminal and the non-inverting input terminal;
a first capacitor including one end to which an output of the differential amplifier is applied and the other end to which a ground potential is applied;
a converter configured to convert a voltage based on the output of the differential amplifier into a current and to output the current; and
a current amplifier configured to amplify the current outputted from the converter,
wherein a power supply voltage of the differential amplifier and a power supply voltage of the converter are dependent on the output voltage, and
wherein the reference voltage corresponds to the input offset voltage.

2. The linear power supply circuit of claim 1, wherein the output transistor is configured to supply the output voltage to a load.

3. A linear power supply circuit, comprising:
an output transistor provided between an input terminal to which an input voltage is applied and an output terminal to which an output voltage is applied; and
a driver configured to drive the output transistor based on a difference between a voltage based on the output voltage and a reference voltage,
wherein the driver includes:
a differential amplifier configured to output a voltage corresponding to the difference between the voltage based on the output voltage and the reference voltage, and including:

an inverting input terminal to which a first voltage is applied;

a non-inverting input terminal to which a second voltage proportional to the first voltage is applied; and an offset part configured to generate a predetermined input offset voltage between the inverting input terminal and the non-inverting input terminal;

a first capacitor including one end to which an output of the differential amplifier is applied and the other end to which the voltage based on the output voltage is applied;

a converter configured to convert a voltage based on the output of the differential amplifier into a current and to output the current; and a current amplifier configured to amplify the current outputted from the converter, wherein a power supply voltage of the differential amplifier is a first constant voltage and a power supply voltage of the current amplifier is a second constant voltage, or the power supply voltage of the differential amplifier and the power supply voltage of the current amplifier are the input voltage, and wherein the reference voltage corresponds to the input offset voltage.

4. The linear power supply circuit of claim 1, wherein a power supply voltage of the current amplifier is a constant voltage.

5. The linear power supply circuit of claim 1, wherein a withstand voltage of the differential amplifier and a withstand voltage of the converter are lower than a withstand voltage of the current amplifier.

6. The linear power supply circuit of claim 1, wherein a gain of the differential amplifier is smaller than a gain of the current amplifier.

7. The linear power supply circuit of claim 1, wherein the current amplifier includes a plurality of current sink type current mirror circuits and a plurality of current source type current mirror circuits, wherein a mirror ratio of each of the current sink type current mirror circuits is 5 or smaller, and wherein a mirror ratio of each of the current source type current mirror circuits is 5 or smaller.

8. A vehicle comprising the linear power supply circuit of claim 1.

9. The linear power supply circuit of claim 3, wherein the output transistor is configured to supply the output voltage to a load.

10. The linear power supply circuit of claim 3, wherein a withstand voltage of the differential amplifier and a withstand voltage of the converter are lower than a withstand voltage of the current amplifier.

11. The linear power supply circuit of claim 3, wherein a gain of the differential amplifier is smaller than a gain of the current amplifier.

12. The linear power supply circuit of claim 3, wherein the current amplifier includes a plurality of current sink type current mirror circuits and a plurality of current source type current mirror circuits, wherein a mirror ratio of each of the current sink type current mirror circuits is 5 or smaller, and wherein a mirror ratio of each of the current source type current mirror circuits is 5 or smaller.

13. A vehicle comprising the linear power supply circuit of claim 3.

* * * * *